(12) United States Patent
Kaneko et al.

(10) Patent No.: US 6,992,864 B2
(45) Date of Patent: Jan. 31, 2006

(54) FLEXIBLE PRINTED CIRCUIT BOARD UNIT CONTRIBUTING TO RELIABLE SOLDERING AND SUPPRESSION OF INCREASED TEMPERATURE

(75) Inventors: Hisashi Kaneko, Kawasaki (JP);
Hiroyuki Iwahara, Kawasaki (JP);
Yukihiro Komura, Kawasaki (JP);
Mitsuhiro Izumi, Kawasaki (JP);
Shinji Fujimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 199 days.

(21) Appl. No.: 10/707,889

(22) Filed: Jan. 21, 2004

(65) Prior Publication Data
US 2004/0179306 A1   Sep. 16, 2004

(30) Foreign Application Priority Data
Mar. 12, 2003   (JP) .............................. 2003-066043

(51) Int. Cl.
*G11B 5/48* (2006.01)
(52) U.S. Cl. ................. 360/264.2; 361/749; 361/751
(58) Field of Classification Search ............ 360/264.2, 360/245.9; 361/751
See application file for complete search history.

(56) References Cited

U.S. PATENT DOCUMENTS

| 6,021,025 | A   |   | 2/2000 | Komura et al. ............. 360/106 |
| 6,618,225 | B2 | * | 9/2003 | Shimizu et al. .......... 360/224.1 |
| 6,728,071 | B2 | * | 4/2004 | Shimizu .................. 360/244.1 |
| 6,863,962 | B2 | * | 3/2005 | Nakatani et al. ............ 428/209 |
| 2003/0015348 | A1 | * | 1/2003 | Lee et al. .................... 174/260 |

\* cited by examiner

*Primary Examiner*—Jefferson Evans
(74) *Attorney, Agent, or Firm*—Armstrong, Kratz, Quintos, Hanson & Brooks, LLP

(57) ABSTRACT

A thermal component is mounted on the front surface of an isolator sheet within a first specific area. A thermally-conductive material is located on the back surface of the isolator sheet on the back of the first specific area. An electrically-conductive material is located on the front surface of the isolator sheet within a second specific area. A thermally-insulating material is located on the back surface of the isolator sheet on the back of the second specific area. The flexible printed circuit board unit of this type allows heat of the thermal component to efficiently radiate from the thermally-conductive material. An increase in temperature can be suppressed in the thermal component. Heat can reliably stay in the electrically-conductive material when a solder material is applied to the surface of the electrically-conductive material. The solder material is allowed to reliably fuse.

9 Claims, 4 Drawing Sheets

FLEXIBLE PRINTED CIRCUIT BOARD UNIT CONTRIBUTING TO RELIABLE SOLDERING AND SUPPRESSION OF INCREASED TEMPERATURE

BACKGROUND OF THE INVENTION

1. Field of the Invention

The present invention relates to a recording disk drive or storage device utilized to manage information data based on a recording medium such as a hard disk (HD), for example. In particular, the invention relates to a flexible printed circuit board unit incorporated in such a recording disk drive.

2. Description of the Prior Art

A head actuator having an actuator block is incorporated in a hard disk drive (HDD). A read element and/or a write element are supported on the head actuator. When the actuator block rotates around a specific support shaft, the read and write elements can be positioned right above a target recording track on the magnetic recording disk.

A flexible printed circuit board unit is fixed on the actuator block. A relay flexible printed circuit board is connected to the flexible printed circuit board unit. A preamplifier IC is mounted on the surface of the flexible printed circuit board unit. The relay flexible printed circuit board is utilized to supply the read and write elements with sensing and writing currents output from the preamplifier IC.

When the flexible printed circuit board unit is fixed to the actuator block, the flexible printed circuit board unit is lined with a thermally-insulating sheet. The thermally-insulating sheet serves to thermally isolate the flexible printed circuit board unit and the actuator block. Heat transfer is totally prevented between the flexible printed circuit board unit and the actuator block. Without thermal isolation between the flexible printed circuit board unit and the actuator block in this manner, soldering cannot be achieved on the surface of the flexible printed circuit board unit. If the flexible printed circuit board unit contacts the actuator block, heat tends to escape from the solder material toward the actuator block, so that the solder material cannot sufficiently enjoy an increased temperature. A wiring pattern on the relay flexible printed circuit board thus cannot be soldered to a wiring pattern on the flexible printed circuit board unit.

Faster processing of data induces a larger heat energy in an electronic component such as a preamplifier IC. If the electronic component suffers from an excessive increase in temperature, the electronic component may fail. It is therefore desired to suppress to the utmost an increase in temperature in an electronic component.

SUMMARY OF THE INVENTION

It is accordingly an object of the present invention to provide a flexible printed circuit board unit capable of reliably realizing fusing of a solder material mounted thereon, and at the same time, of avoiding increase in temperature in an electronic component mounted thereon.

According to a first aspect of the present invention, there is provided a flexible printed circuit board unit comprising: a flexible electrically-isolator sheet; a thermal component mounted on the front surface of the electrically-isolator sheet within a first specific area; a thermally-conductive material located on the back surface of the electrically-isolator sheet on the back of the first specific area; an electrically-conductive material located on the front surface of the electrically-isolator sheet within a second specific area, said electrically-conductive material designed to receive a solder material; and a thermally-insulating material located on the back surface of the electrically-isolator sheet on the back of the second specific area, said thermally-insulating material having a thermal conductivity smaller than that of the thermally-conductive material.

The flexible printed circuit board unit of this type allows heat of the thermal component to efficiently radiate from the thermally-conductive material since the first specific area of the electrically-isolator sheet is lined with the thermally-conductive material. An increase in temperature can thus efficiently be suppressed in the thermal component. In addition, heat can reliably stay in the electrically-conductive material when the solder material is applied to the surface of the electrically-conductive material, since the second specific area of the electrically-isolator sheet is lined with the thermally-insulating material. The solder material thus reliably enjoys an increased temperature. The solder material is allowed to reliably fuse.

The front surface of the thermally-conductive material, receiving the back surface of the electrically-isolator sheet, may be aligned within a plane with the front surface of the thermally-insulating material, receiving the back surface of the electrically-isolator sheet. In this case, the electrically-isolator sheet is allowed to extend flat along a plane. Inflection can reliably be avoided in the electrically-isolator sheet. The thermal component can be located as close to the electrically-conductive material as possible on the electrically-isolator sheet. The size of the flexible printed circuit board unit can thus be reduced. In general, the thermal component such as an integrated circuit (IC) chip cannot be mounted on the inflection such as a curved surface along a step. If an inflection is formed in the electrically-isolator sheet, the location of the thermal component is limited.

In addition, the flexible printed circuit board unit may further comprise a thermally-conductive plate designed to receive the thermally-conductive material and the thermally-insulating material. If the thickness is equally set for the thermally-conductive material and the thermally-insulating material on the thermally-conductive plate in the flexible printed circuit board unit, the front surface of the thermally-conductive material can be aligned within a plane with the front surface of the thermally-insulating material in a facilitated manner.

Alternatively, a depression may be defined in the thermally-conductive material in the flexible printed circuit board unit. In this case, the depression is designed to receive the thermally-insulating material. When the thermally-insulating material is received within the depression, the front surface of the thermally-conductive material can be aligned within a plane with the front surface of the thermally-insulating material in a facilitated manner, even in the case where the thermally-insulating material is interposed between a part of the thermally-conductive material and the electrically-isolator sheet. The thermally-conductive material is preferably made of a plate having a constant thickness. The thermally-conductive material may be provided by simply bending such a plate.

According to a second aspect of the present invention, there is provided a recording disk drive comprising: a flexible electrically-isolator sheet; a thermal component mounted on the front surface of the electrically-isolator sheet within a first specific area; a thermally-conductive material located on the back surface of the electrically-isolator sheet on the back of the first specific area; an electrically-conductive material located on the front surface of the electrically-isolator sheet within a second specific area, said electrically-conductive material designed to receive a solder material; a thermally-insulating material located on the back surface of the electrically-isolator sheet on the back of the second specific area, said thermally-insulating material having a thermal conductivity smaller than that of the thermally-conductive material; and a thermally-conductive plate designed to receive the thermally-conductive material and the thermally-insulating material.

The recording disk drive of this type allows heat of the thermal component to efficiently escape to the thermally-conductive plate through the thermally-conductive material since the first specific area of the electrically-isolator sheet is lined with the thermally-conductive material. The heat is allowed to radiate from the thermally-conductive plate. An increase in temperature can thus efficiently be suppressed in the thermal component. In addition, heat can reliably stay in the electrically-conductive material when the solder material is applied to the surface of the electrically-conductive material, since the second specific area of the electrically-isolator sheet is lined with the thermally-insulating material. The solder material thus reliably enjoys an increased temperature. The solder material is allowed to reliably fuse.

According to a third aspect of the present invention, there is provided a recording disk drive comprising: an actuator block defining a first flat surface and a second flat surface having a level lower than the first flat surface; a thermally-conductive plate having a first area received on the first flat surface and a second area received on the second flat surface; a thermally-insulating material received on the second area of the thermally-conductive plate, said thermally-insulating material having a thermal conductivity smaller than that of the thermally-conductive plate; and a flexible printed circuit board received flush continuously on the thermally-insulating material and the thermally-conductive plate.

The recording disk drive of this type allows the flexible printed circuit board to extend flat along a plane even when the thermally-conductive material is interposed between the thermally-conductive plate and the flexible printed circuit board on the actuator block. Inflection can reliably be avoided in the flexible printed circuit board. Any undesirable limitation can be avoided when one locates electronic components such as a preamplifier IC and the like as well as electrically-conductive materials such as wiring patterns and electrically-conductive pads in designing the flexible printed circuit board. A preamplifier IC may be mounted on the surface of the flexible printed circuit board over the first area of the thermally-conductive plate. An electrically-conductive material may be located on the surface of the flexible printed circuit board over the second area of the thermally-conductive plate so as to receive a solder material.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
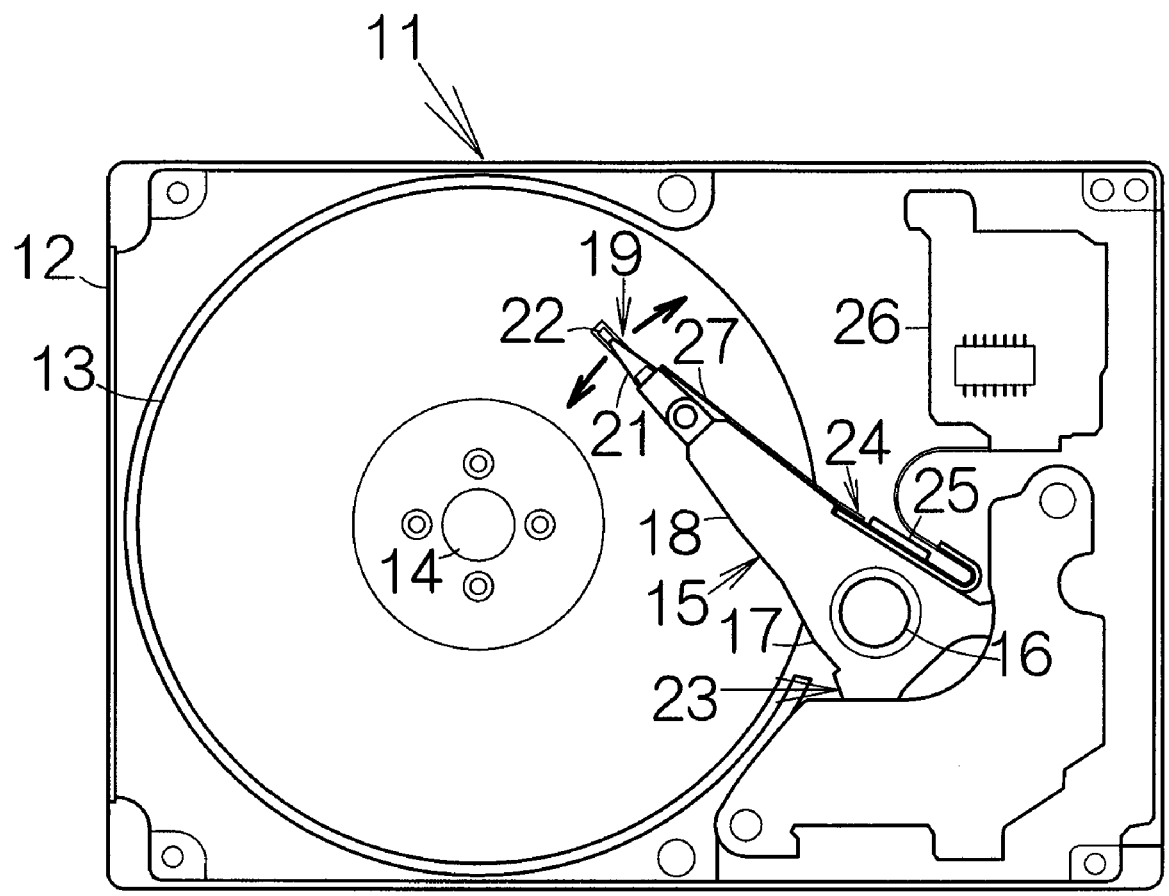
FIG. 1 is a plan view schematically illustrating the structure of a hard disk drive (HDD) as a specific example of a recording disk drive.

FIG. 1 schematically illustrates the inner structure of a hard disk drive (HDD) 11 as an example of a magnetic recording medium drive or storage device. The HDD 11 includes a box-shaped main enclosure 12 defining an inner space of a flat parallelepiped, for example. At least one magnetic recording disk 13 is incorporated within the inner space of the main enclosure 12. The magnetic disk 13 is mounted on the driving shaft of a spindle motor 14. The spindle motor 14 is allowed to drive the magnetic recording disk 13 for rotation at a higher revolution speed such as 7,200 rpm, 10,000 rpm, or the like, for example. A cover, not shown, is coupled to the main enclosure 12 so as to define the closed inner space between the main enclosure 12 and the cover itself.

A head actuator 15 is also incorporated within the inner space of the main enclosure 12. The head actuator 15 comprises an actuator block 17 coupled to a vertical support shaft 16 for relative rotation. Rigid actuator arms 18 are defined in the actuator block 17. The actuator arms 18 are designed to extend in the horizontal direction from the vertical support shaft 16. The actuator arms 18 are related to the front and back surfaces of the magnetic recording disk 13. The actuator block 17 may be made of aluminum. Molding process may be employed to form the actuator block 17.

Head suspension assemblies 19 are fixed to the tip ends of the actuator arms 18. The individual head suspension assembly 19 includes a load beam 21 extending forward from the corresponding tip end of the actuator arm 18. A so-called elastic bend section is defined in the load beam 21. The elastic bend section is coupled to the front or tip end of the actuator arm 18. The elastic bend section establishes an elasticity urging the front or tip end of the load beam 21 toward the surface of the magnetic recording disk 13. A flying head slider 22 is supported on the front end of the load beam 21. The flying head slider 22 is received on a gimbal, not shown, attached to the load beam 21. The gimbal serves to allow the flying head slider 22 to change its attitude. The flying head sliders 22 are opposed to the surfaces of the magnetic recording disk or disks 13.

An electromagnetic transducer, not shown, is mounted on the flying head slider 22. The electromagnetic transducer may include a read element and a write element. The read element may include a giant magnetoresistive (GMR) element or a tunnel-junction magnetoresistive (TMR) element designed to discriminate magnetic bit data on the magnetic recording disk 13 by utilizing variation in the electric resistance of a spin valve film or a tunnel-junction film, for example. The write element may include a thin film magnetic head designed to write magnetic bit data into the magnetic recording disk 13 by utilizing a magnetic field induced at a thin film coil pattern.

When the magnetic recording disk 13 rotates, the flying head slider 22 is allowed to receive airflow generated along the rotating magnetic recording disk 13. The airflow serves to generate a positive pressure or lift and a negative pressure on the flying head slider 22. The flying head slider 22 is thus allowed to keep flying above the surface of the magnetic recording disk 13 during the rotation of the magnetic recording disk 13 at a higher stability established by the balance between the urging force of the load beam 21 and the lift as well as the negative pressure.

A power source 23 such as a voice coil motor (VCM) is connected to the actuator block 17. The power source 23 is designed to drive the actuator block 17 for rotation around the support shaft 16. The rotation of the actuator block 17 induces the swinging movement of the actuator arms 18 and the head suspension assemblies 19. When the actuator arm 18 is driven to swing about the support shaft 16 during the flight of the flying head slider 22, the flying head slider 22 is allowed to cross the recording tracks defined on the magnetic recording disk 13 in the radial direction of the magnetic recording disk 13. This radial movement serves to position the flying head slider 21 right above a target recording track on the magnetic recording disk 13. As conventionally known, in the case where two or more magnetic recording disks 13 are incorporated within the inner space of the main enclosure 12, a pair of the actuator arm 18 as well as a pair of the head suspension assembly 19 is disposed between the adjacent magnetic recording disks 13.

As is apparent from FIG. 1, a flexible printed circuit board unit 24 is superposed on the actuator block 17. A head IC (integrated circuit) or preamplifier IC 25 is incorporated in the flexible printed circuit board unit 24. The preamplifier IC 25 is designed to supply the read element with a sensing current when the magnetic bit data is to be read. The preamplifier IC 25 is also designed to supply the write element with a writing current when the magnetic bit data is to be written. A small-sized circuit board 26 is located within the inner space of the main enclosure 12. The circuit board 26 is designed to supply the preamplifier IC 25 on the flexible printed circuit board unit 24 with control signals, any electric current or any electric voltage. A printed circuit board, not shown, may be coupled to the back of the bottom plate of the main enclosure 12. The printed circuit board may also be designed to supply the preamplifier IC 25 on the flexible printed circuit board unit 24 with control signals, any electric current or any electric voltage.

Relay flexible printed circuit boards 27 are located on the actuator block 17 for the individual head suspension assemblies 19. The relay flexible printed circuit board 27 extends from the root of the actuator arm 18 to the tip end of the actuator arm 18. The rear end of the relay flexible printed circuit board 27 is coupled to the flexible printed circuit board unit 24. The front end of the relay flexible printed circuit board 27 is coupled to the gimbal in the head suspension assembly 19. Predetermined wiring patterns are established on the gimbal. The wiring patterns are individually connected to the read and write elements. Wiring patterns are also established on the relay flexible printed circuit board 27. The wiring patterns on the relay flexible printed circuit board 27 are individually connected to the wiring patterns on the gimbal. The wiring patterns may be made of an electrically-conductive material.

Figure 2:
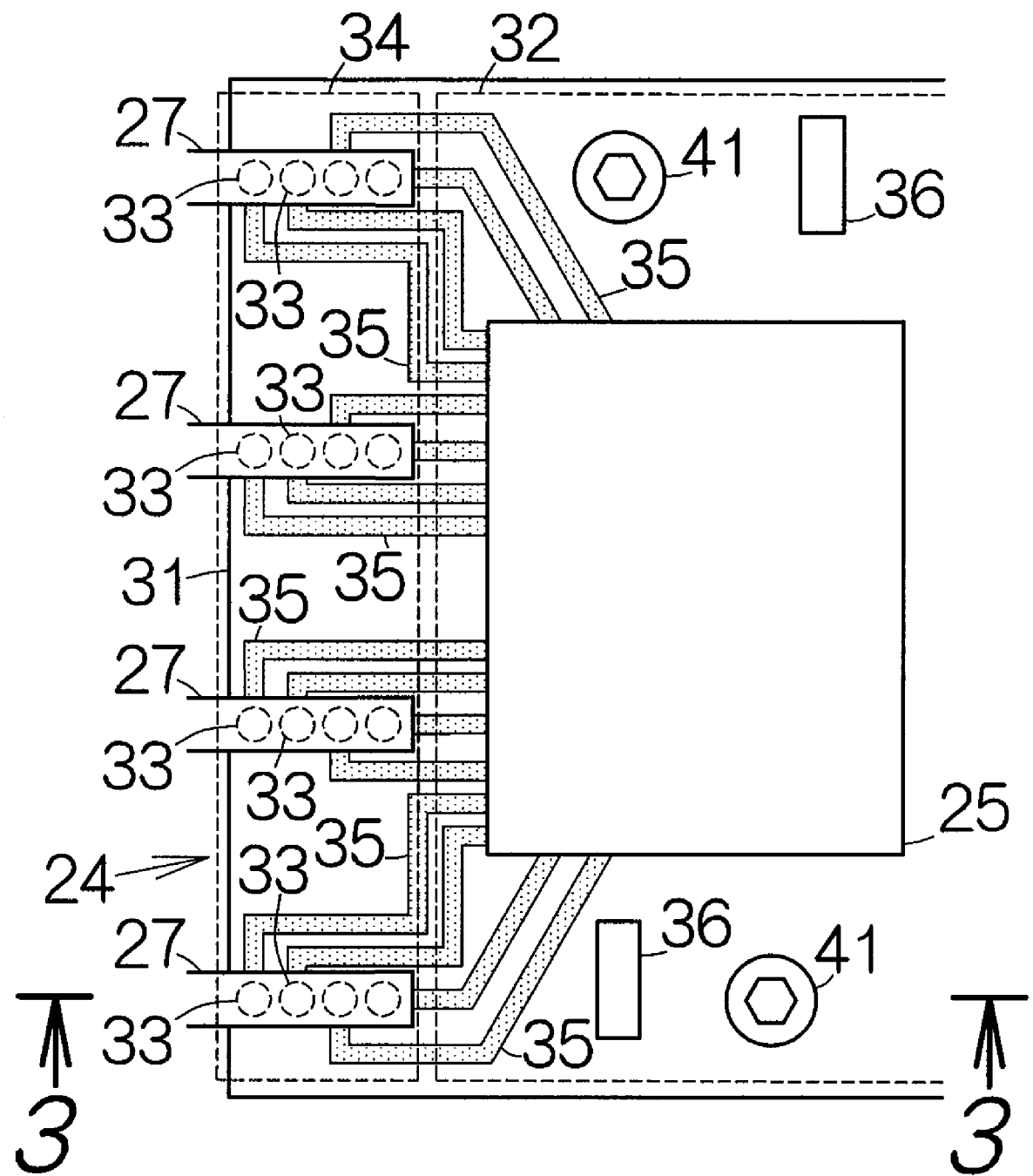
FIG. 2 is an enlarged partial plan view schematically illustrating a part of a flexible printed circuit board unit according to a first embodiment of the present invention.

As shown in FIG. 2, the flexible printed circuit board unit 24 includes a flexible electrically-insulating or isolator sheet 31 according to a first embodiment of the present invention. The aforementioned preamplifier IC 25 is mounted on the front surface of the isolator sheet 31. The preamplifier IC 25 is located in a first specific area 32 on the isolator sheet 31.

Electrically-conductive materials or pads 33 are likewise formed on the front surface of the isolator sheet 31. The electrically-conductive pads 33 are located in a second specific area 34 separated from the first specific area 32. Wiring patterns 35 are established on the front surface of the isolator sheet 31. The wiring patterns 35 serve to establish electric connections between the individual electrically-conductive pads 33 and the preamplifier IC 25, for example. Electronic components 36 may be mounted on the front surface of the isolator sheet 31 in addition to the preamplifier IC 25. Any other wiring patterns may be established on the front surface of the isolator sheet 31 in addition to the aforementioned wiring patterns 35. The wiring patterns may be made of an electrically-conductive material. The relay flexible printed circuit boards 27 cover over the electrically-conductive pads 33. The isolator sheet 31, the preamplifier IC 25, the electrically-conductive pads 33, and the wiring patterns 35 in combination establish a so-called flexible printed circuit board.

Figure 3:
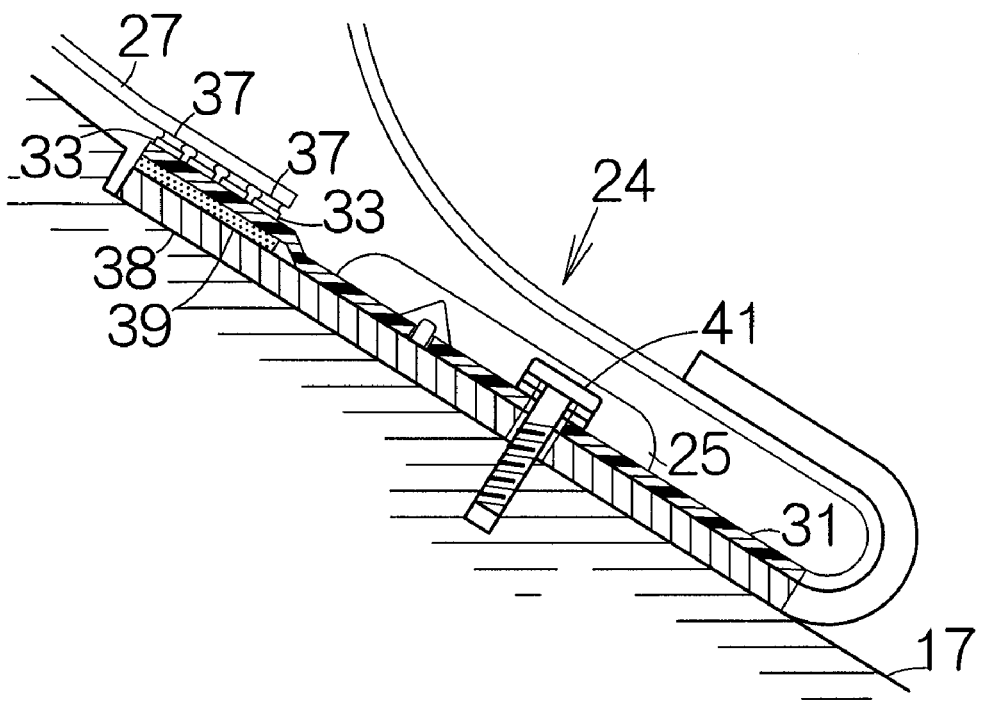
FIG. 3 is a partial sectional view, corresponding to an enlarged partial view of FIG. 1, taken along the line 3—3 in FIG. 2.

As shown in FIG. 3, solder materials 37 are received on the surface of the individual electrically-conductive pads 33. The solder materials 37 serve to establish electric connections between the electrically-conductive pads 33 and the corresponding wiring patterns on the relay flexible printed circuit board 27. The wiring pattern on the gimbal, the wiring pattern on the relay flexible printed circuit board 27, and the electrically-conductive pad 33 and wiring pattern 35 on the flexible printed circuit board unit 24 in combination thus establish a current path between the read element and the preamplifier IC 25. The wiring pattern on the gimbal, the wiring pattern on the relay flexible printed circuit board 27, and the electrically-conductive pad 33 and wiring pattern 35 on the flexible printed circuit board unit 24 in combination likewise establish a current path between the write element and the preamplifier IC 25.

The flexible printed circuit board unit 24 further includes a thermally-conductive supporting plate 38. The isolator sheet 31 is received on the surface of the supporting plate 38. The back surface of the isolator sheet 31 is bonded or adhered to the surface of the supporting plate 38 at least on the back of the first specific area 32 with an adhesive. The supporting plate 38 serves to keep a certain shape of the flexible isolator sheet 31. The supporting plate 38 exhibits a certain rigidity. The supporting plate 38 may be formed based on an aluminum plate having a constant or uniform thickness, for example. Here, the supporting plate 38 serves as the thermally-conductive material of the present invention.

A thermally-insulating material or sheet 39 is located on the back of the second specific area 34. The thermally-insulating sheet 39 is interposed between the isolator sheet 31 and the supporting plate 38. The front surface of the thermally-insulating sheet 39 uniformly contacts the back surface of the isolator sheet 31 without a gap. The front surface of the thermally-insulating sheet 39 may be bonded or adhered to the back surface of the isolator sheet 31 with an adhesive. The back surface of the thermally-insulating sheet 39 may be bonded or adhered to the front surface of the supporting plate 38 with an adhesive. Here, the thermally-insulating sheet 39 has a thermal conductivity at least smaller than that of the supporting plate 38.

A screw 41 may be utilized to fix the flexible printed circuit board unit 24 to the surface of the actuator block 17, for example. The screw 41 is designed to penetrate through the isolator sheet 31 and the supporting plate 38. As shown in FIG. 2, two or more screws 41 may be utilized to fix the flexible printed circuit board unit 24.

When magnetic bit data is to be read or written, the preamplifier IC 25 outputs a sensing current or a writing current toward the read element or the write element. The preamplifier IC 25 induces heat due to the signal processing of high frequency. Since the isolator sheet 31 is lined with the thermally-conductive supporting plate 38, namely a thermally-conductive material, at the first specific area 32, the heat of the preamplifier IC 25 is efficiently transferred to the actuator block 17 through the supporting plate 38. The preamplifier IC 25 can efficiently be prevented from an increase in temperature.

When the HDD 11 is to be assembled, the flexible printed circuit board unit 24 is previously prepared. The isolator sheet 31 and the thermally-insulating sheet 39 are adhered to the front surface of the supporting plate 38 in the flexible printed circuit board unit 24. The preamplifier IC 25 is mounted on the front surface of the isolator sheet 31. The flexible printed circuit board unit 24 is fixed to the surface of the actuator block 17. The entire back surface of the supporting plate 38 uniformly contacts the surface of the actuator block 17.

After the flexible printed circuit board unit 24 has been fixed on the actuator block 17, the relay flexible printed circuit board 27 is incorporated in the HDD 11. The wiring patterns on the relay flexible printed circuit board 27 are opposed to the electrically-conductive pads 33 on the flexible printed circuit board unit 24. The solder materials 37 are located between the wiring patterns on the relay flexible printed circuit board 27 and the electrically-conductive pads 33 on the flexible printed circuit board unit 24. The solder materials 37 may previously be attached to at least one of the wiring pattern and the electrically-conductive pad 33.

A heat block is thereafter urged against the back surface of the relay flexible printed circuit board 27, for example. The heat block supplies heat to the solder materials 37. Since the isolator sheet 31 is lined with the thermally-insulating sheet 39 at the second specific area 34, transfer of the heat is totally prevented between the electrically-conductive pads 33 and the actuator block 17. The heat stays in the solder materials 37 and the electrically-conductive pads 33. The solder materials 37 are thus allowed to reliably enjoy a sufficient increase in temperature. The solder materials 37 then fuse. When the heat block is pulled away from the relay flexible printed circuit board 27, the temperature of the solder materials 37 gets lower. The solder materials 37 then coagulate. Electrical connection is thus established between the wiring patterns on the relay flexible printed circuit board 27 and the electrically-conductive pads 33 on the flexible printed circuit board unit 24. The relay flexible printed circuit board 27 is coupled with the flexible printed circuit board unit 24 in this manner.

Figure 4:
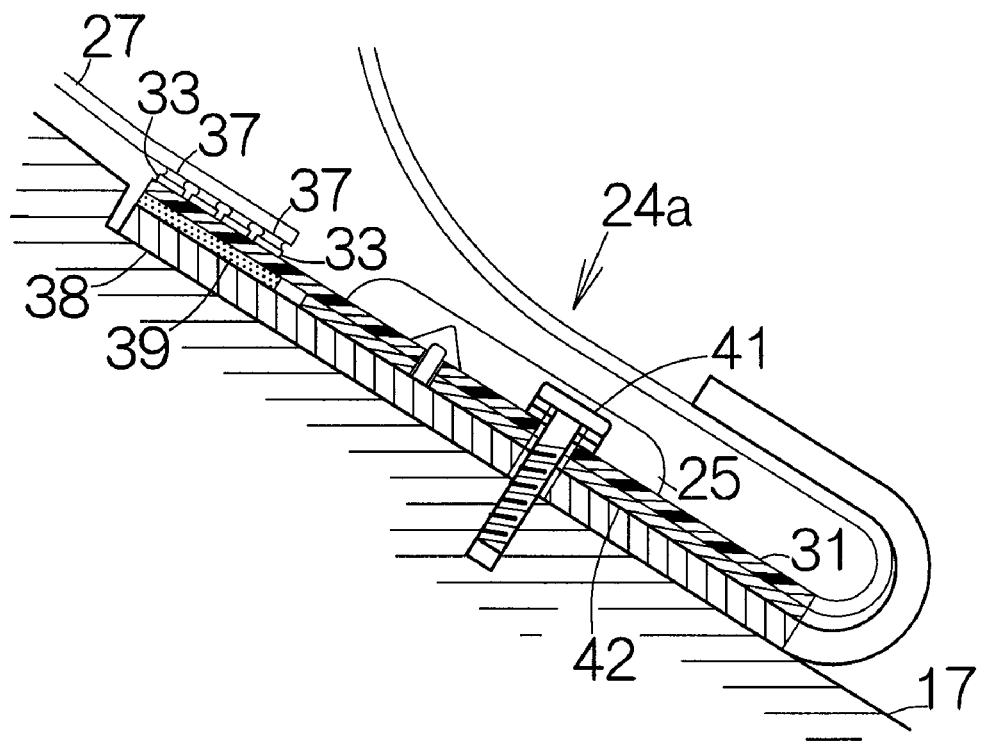
FIG. 4 is an enlarged partial sectional view, corresponding to FIG. 3, schematically illustrating a flexible printed circuit board unit according to a second embodiment of the present invention.

FIG. 4 schematically illustrates a flexible printed circuit board unit 24a according to a second embodiment of the present invention. In this embodiment, a thermally-conductive material or sheet 42 is located on the back of the first specific area 32. The thermally-conductive sheet 42 is distanced from the thermally-insulating sheet 39. The thermally-conductive sheet 42 is interposed between the isolator sheet 31 and the supporting plate 38. The front surface of the thermally-conductive sheet 42 uniformly contacts the back surface of the isolator sheet 31 without a gap. The front surface of the thermally-conductive sheet 42 may be bonded or adhered to the back surface of the isolator sheet 31 with an adhesive. The back surface of the thermally-conductive sheet 42 may be bonded or adhered to the front surface of the supporting plate 38 with an adhesive. Here, the thermally-conductive sheet 42 has a thermal conductivity at least larger than that of the thermally-insulating sheet 39.

The flexible printed circuit board unit 24a allows heat of the preamplifier IC 25 to efficiently escape to the supporting plate 38 and the actuator block 17 through the thermally-conductive sheet 42 in the same manner as described above, since the first specific are 32 is lined with the thermally-conductive sheet 42, namely a thermally-conductive material. An increase in temperature can efficiently be suppressed in the preamplifier IC 25. In addition, transfer of heat can reliably be prevented between the electrically-conductive pads 33 and the actuator block 17 during the assembly of the HDD 11, since the isolator sheet 31 is lined with the thermally-insulating sheet 39 at the second specific area 34. The heat reliably stays within the solder materials 37 and the electrically-conductive pads 33. The solder materials 37 are allowed to reliably fuse.

Moreover, the flexible printed circuit board unit 24a allows the front surface of the thermally-conductive sheet 42 to get aligned within a plane with the front surface of the thermally-insulating sheet 39, as is apparent from FIG. 4. The isolator sheet 31 is allowed to extend flat along a plane. Inflection can be avoided in the isolator sheet 31. The preamplifier IC 25 can be located as close to the electrically-conductive pads 33 as possible. The size of the flexible printed circuit board unit 24 can thus be reduced.

Figure 5:
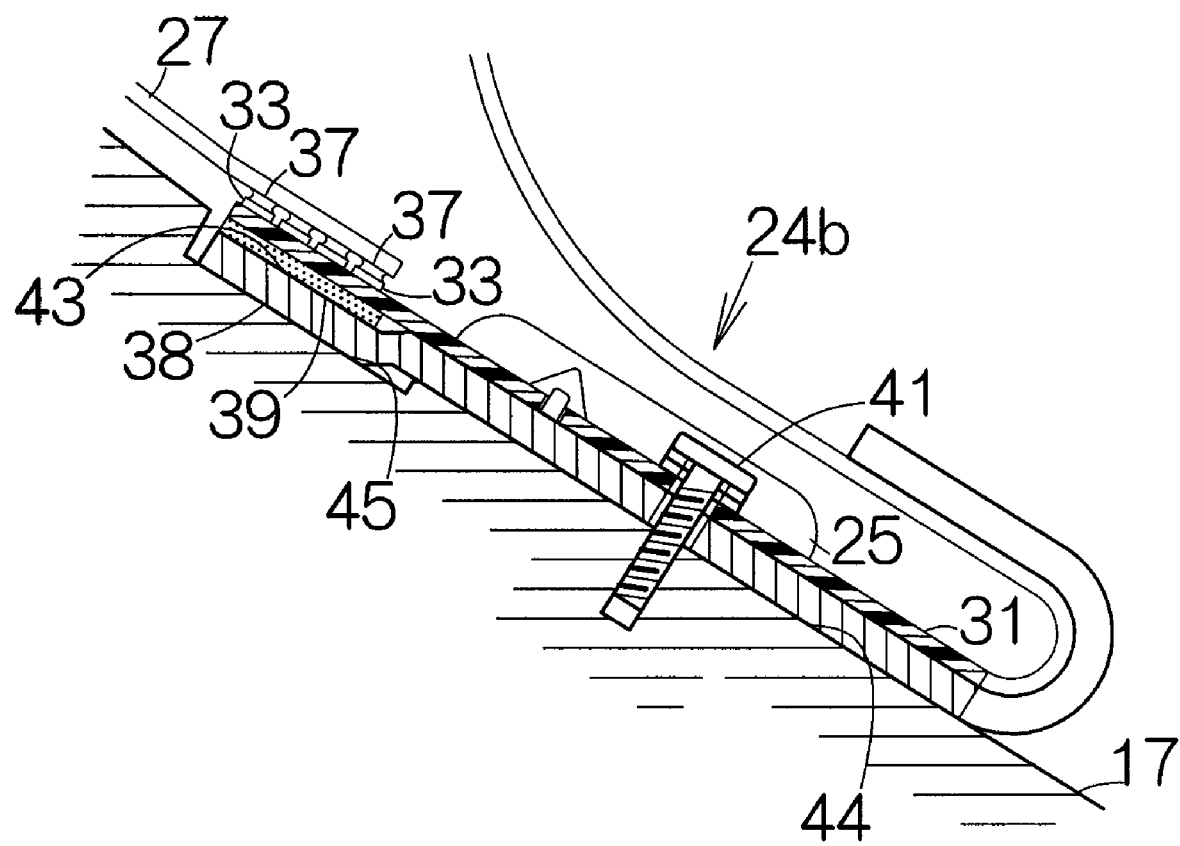
FIG. 5 is an enlarged partial sectional view, corresponding to FIG. 3, schematically illustrating a flexible printed circuit board unit according to a third embodiment of the present invention.

FIG. 5 schematically illustrates a flexible printed circuit board unit 24b according to a third embodiment of the present invention. In this embodiment, a depression 43 is formed on the thermally-conductive material, namely the supporting plate 38. The thermally-insulating sheet 39 is received within the depression 43. As is apparent from FIG. 5, the front surface of the supporting plate 38 can be aligned within a plane with the front surface of the thermally-insulating sheet 39. The isolator sheet 31 is allowed to extend flat along a plane. The preamplifier IC 25 can be located as close to the electrically-conductive pads 33 as possible. The size of the flexible printed circuit board unit 24b can be reduced. Otherwise, the flexible printed circuit board unit 24b according to the third embodiment can perform in the same manner as the aforementioned first and second embodiments.

In particular, a first flat surface 44 and a second flat surface 45 are defined on the surface of the actuator block 17 in this embodiment. The second flat surface 45 is depressed from the first flat surface 44 to have a level lower than the first flat surface 44. The supporting plate 38 defines a first area extending along the first specific area 32 of the isolator sheet 31. The supporting plate 38 is received on the first flat surface 44 at the first area. The supporting plate 38 also defines a second area extending along the second specific area 34 of the isolator sheet 31. The supporting plate 38 is received on the second surface 45 at the second area. In this case, the supporting plate 38 can be made of a plate having a constant thickness. In other words, the supporting plate 38 can be provided by simply bending a plate of a constant thickness.

Any size can be set for the first and second specific areas 32, 34 in the aforementioned flexible printed circuit board unit 24, 24a, 24b. In addition, the first and second specific areas 32, 34 can be located anywhere depending on the situation in the flexible printed circuit board unit 24, 24a, 24b. The thermally-insulating sheet 39 may have a property of thermal insulation to the full extent that the solder material 37 is caused to sufficiently fuse on the electrically-conductive pad 33.

What is claimed is:

1. A flexible printed circuit board unit comprising:
   a flexible electrically-isolator sheet;
   a thermal component mounted on a front surface of the electrically-isolator sheet within a first specific area;
   a thermally-conductive material located on a back surface of the electrically-isolator sheet on the back of the first specific area;
   an electrically-conductive material located on the front surface of the electrically-isolator sheet within a second specific area, said electrically-conductive material designed to receive a solder material; and
   a thermally-insulating material located on the back surface of the electrically-isolator sheet on the back of the second specific area, said thermally-insulating material having a thermal conductivity smaller than that of the thermally-conductive material.

2. The flexible printed circuit board unit according to claim 1, wherein the back surface of the electrically-isolator sheet is received on a front surface of the thermally-conductive material and a front surface of the thermally-insulating material, the front surface of the thermally-conductive material being aligned within a plane with the front surface of the thermally-insulating material.

3. The flexible printed circuit board unit according to claim 2, further comprising a thermally-conductive plate designed to receive the thermally-conductive material and the thermally-insulating material.

4. The flexible printed circuit board unit according to claim 2, wherein a depression is defined in the thermally-conductive material, the depression designed to receive the thermally-insulating material.

5. The flexible printed circuit board unit according to claim 4, wherein the thermally-conductive material is made of a plate having a constant thickness.

6. A recording disk drive comprising:
   a flexible electrically-isolator sheet;
   a thermal component mounted on a front surface of the electrically-isolator sheet within a first specific area;
   a thermally-conductive material located on a back surface of the electrically-isolator sheet on the back of the first specific area;
   an electrically-conductive material located on the front surface of the electrically-isolator sheet within a second specific area, said electrically-conductive material designed to receive a solder material;
   a thermally-insulating material located on the back surface of the electrically-isolator sheet on the back of the second specific area, said thermally-insulating material having a thermal conductivity smaller than that of the thermally-conductive material; and
   a thermally-conductive plate designed to receive the thermally-conductive material and the thermally-insulating material.

7. A recording disk drive comprising:
   an actuator block defining a first flat surface and a second flat surface having a level lower than the first flat surface;
   a thermally-conductive plate having a first area received on the first flat surface and a second area received on the second flat surface;
   a thermally-insulating material received on the second area of the thermally-conductive plate, said thermally-insulating material having a thermal conductivity smaller than that of the thermally-conductive plate; and
   a flexible printed circuit board received flush continuously on the thermally-insulating material and the thermally-conductive plate.

8. The recording disk drive according to claim 7, wherein a preamplifier IC is mounted on a surface of the flexible printed circuit board over the first area of the thermally-conductive plate.

9. The recording disk drive according to claim 8, wherein an electrically-conductive material is located on the surface of the flexible printed circuit board over the second area of the thermally-conductive plate, said electrically-conductive material designed to receive a solder material.

* * * * *